United States Patent
Ng et al.

(10) Patent No.: US 6,724,680 B1
(45) Date of Patent: Apr. 20, 2004

(54) SINGLE INTEGRATED CIRCUIT FLASH MEMORY CONTROLLER FOR ACTIVATING EXTERNAL ROM SHARING A COMMON USB PORT

(75) Inventors: Soo-Ching Ng, Hsinchu Hsien (TW); Chee-Kong Awyong, Hsinchu Hsien (TW)

(73) Assignee: Phison Electronics Corp., Hsinchu Hsien (TW)

( * ) Notice: Subject to any disclaimer, the term of this patent is extended or adjusted under 35 U.S.C. 154(b) by 0 days.

(21) Appl. No.: 10/457,405

(22) Filed: Jun. 10, 2003

(51) Int. Cl.$^7$ ................................................. G11C 8/00
(52) U.S. Cl. ........................ 365/230.03; 365/189.01; 365/189.05; 365/230.08
(58) Field of Search ................ 365/230.03, 189.01, 365/189.05, 230.08; 713/501

(56) References Cited

U.S. PATENT DOCUMENTS 5,634,079 A * 5/1997 Buxton .......................... 710/72
5,951,685 A * 9/1999 Stancil .......................... 713/2
5,991,889 A * 11/1999 Hikichi et al. ................ 713/501
6,647,100 B1 * 11/2003 Sneed ........................ 379/93.05

* cited by examiner

Primary Examiner—Son T. Dinh
(74) Attorney, Agent, or Firm—Birch, Stewart, Kolasch & Birch, LLP

(57) ABSTRACT

A single integrated circuit flash memory controller is provided. When the CPU is operating, the operating time of the external ROM and all the flash memory devices are designed or programmed to function in an alternative manner, for example, the flash memory device will not be activated while the external ROM is operating to retrieve the program code. On the contrary, while data is being retrieved from the flash memory device, the CPU will be in a waiting status, in other words, the CPU does not function to retrieve the program code from the external ROM while the data is being retrieved from the flash memory device. Accordingly, this design makes it possible for the single integrated circuit flash memory control to accommodate required connections for connecting with the external ROM as well as all the flash memory device without the need to increasing pin terminals or the size of the integrated circuit package.

3 Claims, 5 Drawing Sheets

SINGLE INTEGRATED CIRCUIT FLASH MEMORY CONTROLLER FOR ACTIVATING EXTERNAL ROM SHARING A COMMON USB PORT

BACKGROUND OF THE INVENTION

1. The Field of the Invention

The present invention relates to a single integrated circuit flash memory controller, and more particularly to a single IC flash memory controller for activating external ROM sharing a common USB port so that no extra pin terminals is required incurring no extra space occupation.

2. Description of the Related Art

With the rapid development in the information technology, ideally most of the circuit systems are integrated into a single integrated circuit, so that single integrate circuit having multi-function can be designed with a view of making a more compact, smaller in size and less expensive electronic products.

Referring to FIG. 1, a typical single integrated circuit 10 comprises a CPU 11, and the program code of the CPU 11 can be retrieved by two methods. One method includes retrieving the program code prestored in an internal ROM 12 directly via the route set within the single integrated circuit 10. The other method includes retrieving the program code prestored in an external ROM 13 by connecting to the external ROM 13 through an external connection port comprising a plurality of pin terminals with the single integrated circuit 10. However, in some particular circumstances, the external ROM 13 must be connected to the single integrated circuit 10, for example, when the storage space of the internal ROM 12 is insufficient or the program code of the internal ROM 12 needs to be modified according to various requirements, and the like. In the condition mentioned above, the CPU 11 needs to have external connection port for connecting the external ROM 13 for communication with the single integrated circuit 10 so that the modified program code of the CPU 11 can be retrieved. Accordingly, most of the single integrated circuit 10 has a reserved route for connecting with the external ROM 13.

Generally, the ROM that can be applied in the single integrated circuit is classified as writable fash ROM and write-once Mask ROM. The single integrated circuit with flash ROM is advantageously suitable for modification of the CPU program code according to various requirements or renewing the CPU program code, and therefore the single integrated circuit with flash ROM are easy to upgrade the products. However, the cost of such type of flash ROM is more expensive.

As shown in FIG. 2, shows another circuit layout comprising a single integrated circuit flash memory integrated circuit 20 having a low cost internal Mask ROM 21 connected to an external flash ROM 22 in order to extend the memory capacity of the single integrated flash memory integrated circuit 20. Thus the Mask ROM 21 can be used in a general situation when it is needed to improve the function of the single integrated circuit flash memory integrated circuit 20, the external flash ROM 22 is used for renewing the program code of CPU 23 when necessary.

Nevertheless, the single integrated circuit flash memory integrated circuit 20 not only connects to the pin terminals of a server 24 but also connects to the pin terminals of a plurality of flash Memory devices 25 which function as a data storage unit. Additionally, the single integrated circuit flash memory integrated circuit 20 also needs connects to the pin terminals of the external flash ROM 22, but however, the single integrated circuit flash memory integrated circuit 20 does not have sufficient pin terminals for implementing such connections. Therefore, it is highly desirable to increase the numbers of the pin terminals of the single integrated circuit flash memory integrated circuit 20 in order to meet above requirements. One way of overcoming the above problems is to increase the overall size of the integrated circuit package however this would substantially increase the fabrication cost.

SUMMARY OF THE INVENTION

Accordingly, in the view of the foregoing, the present inventor makes a detailed study of related art to evaluate and consider, and uses years of accumulated experience in this field, and through several experiments, to create a new single integrated circuit flash memory controller for activating an external ROM sharing a common USB port so that no extra pin terminals is required incurring no extra space occupation. The present invention provides a novel and cost effective single integrated circuit flash memory controller for activating the external ROM.

According to one aspect of the present invention the single integrated circuit flash memory controller having a shared USB port for connecting both the flash memory and the external ROM, such that while retrieving data from the flash memory, the external ROM still remain in operational status.

According to the above aspect of the present invention, the external ROM and all of the flash memory devices share the same data and IP USB port, and more particularly the external ROM and all the flash memory share the same pin terminals of the data and IP USB port. When the CPU is operating, the operating time of the external ROM and all the flash memory are designed or programmed to function in an alternative manner, for example, the flash memory will not be activated while the external ROM is operating to retrieve the program code. On the contrary, while data is being retrieved from the flash memory, the CPU will be in a waiting status, in other words, the CPU does not function to retrieve the program code from the external ROM while the data is being retrieved from the flash memory. Accordingly, this design makes it possible for the single integrated circuit flash memory controller to accommodate required connections for connecting with the external ROM as well as all the flash memory without the need to increasing pin terminals or the size of the integrated circuit package.

BRIEF DESCRIPTION OF THE DRAWING

For a more complete understanding of the present invention, reference will now be made to the following detailed description of preferred embodiments taken in conjunction with the accompanying drawings, in which.

DETAILED DESCRIPTION OF PREFERRED EMBODIMENTS

Figure 1:
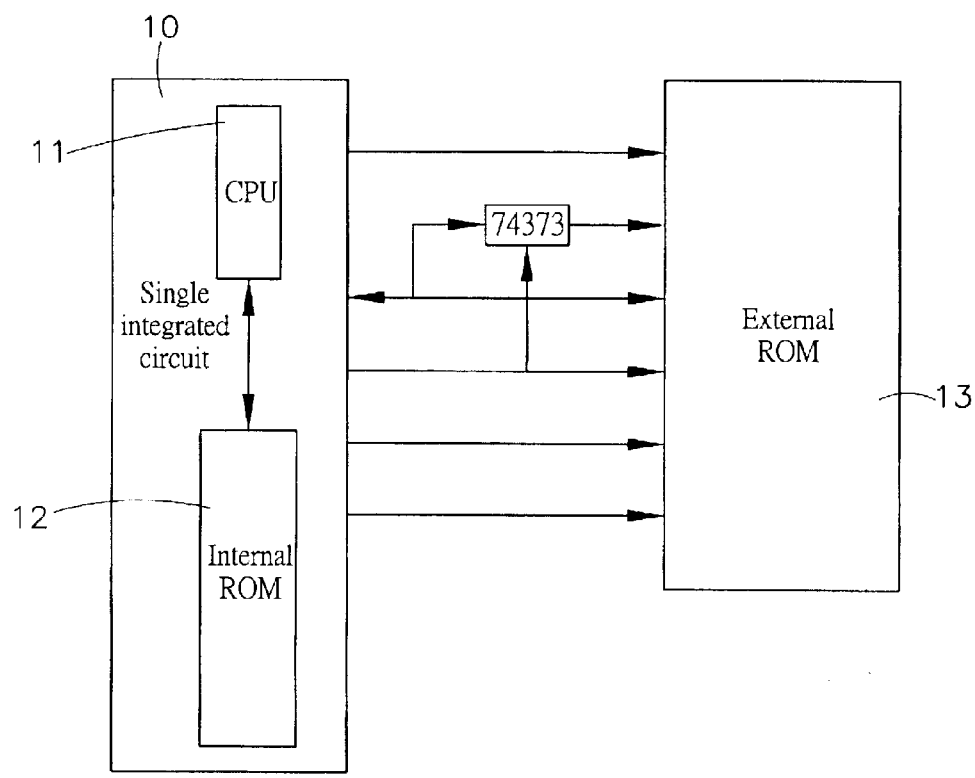
FIG. 1 is a flowchart illustrating the operation process of using conventional single integrated circuit flash memory controller.
Figure 2:
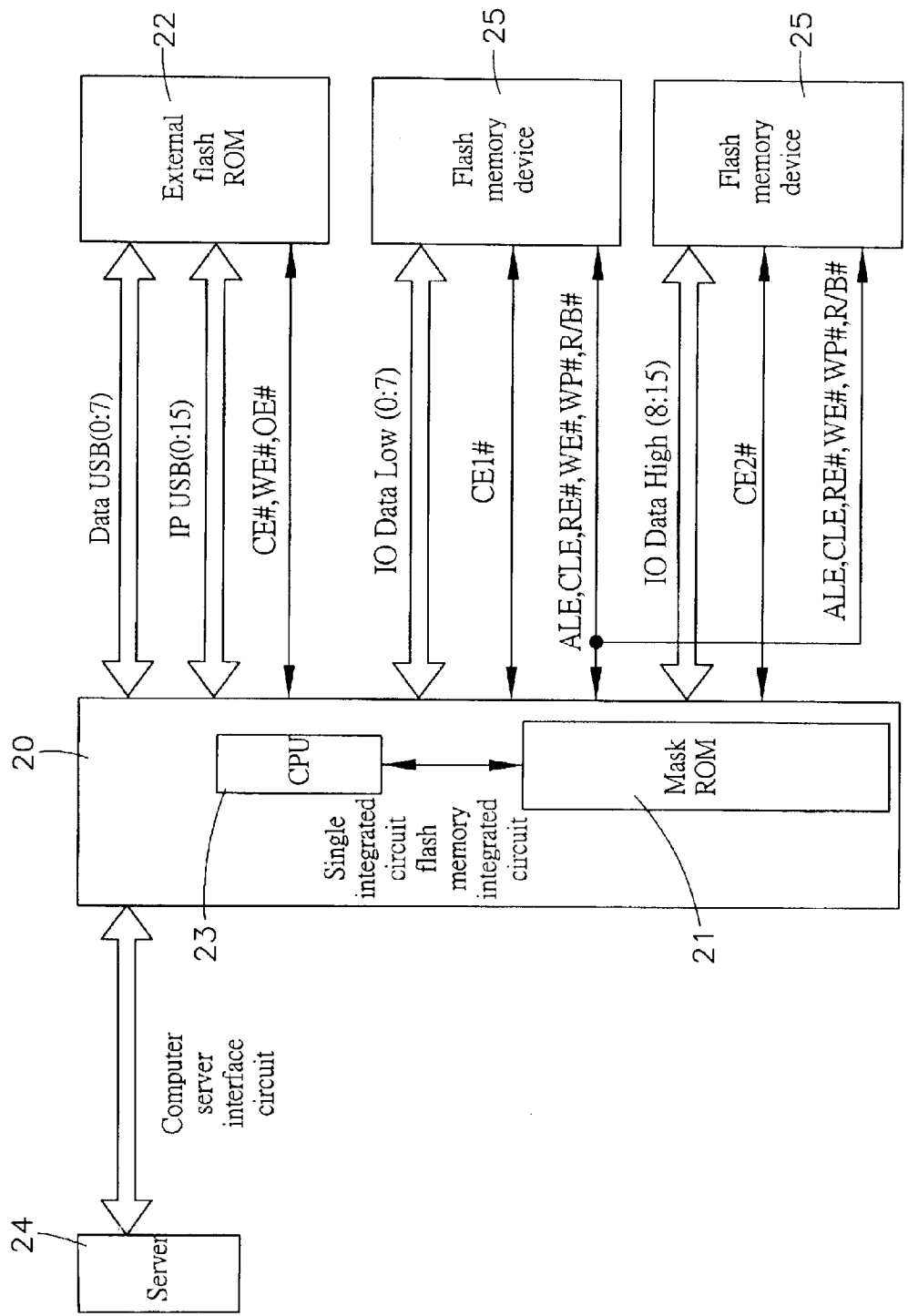
FIG. 2 is another flowchart illustrating the operation process using a conventional single integrated circuit flash memory controller.

Reference will be made in detail to the preferred embodiments of the invention, examples of which are illustrated in the accompanying drawings. Wherever possible, the same reference numbers are used in the drawings and the description to refer to the same or like parts.

Figure 3:
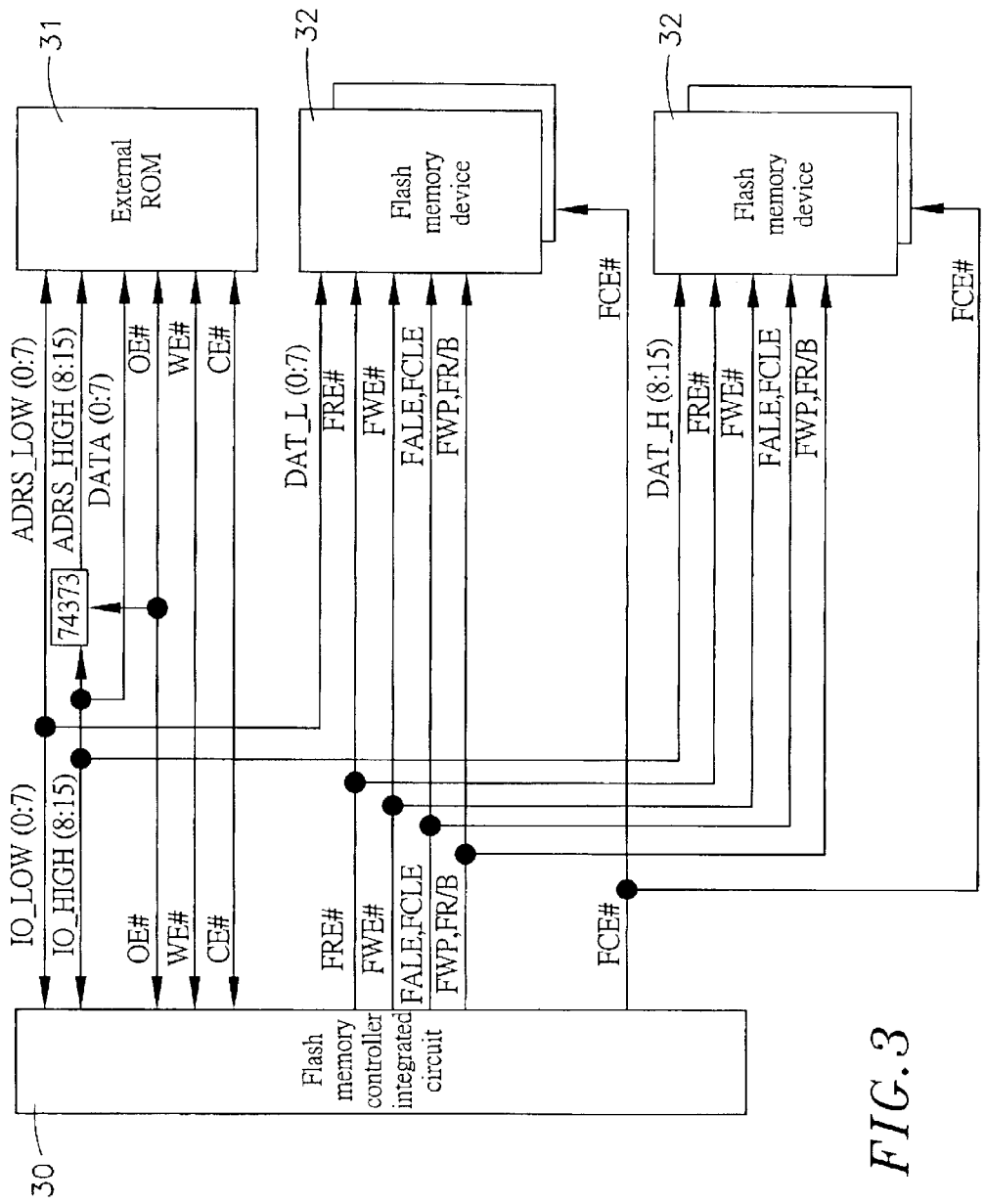
FIG. 3 is a flowchart illustrating the circuit layout (I) using a single integrated circuit flash memory controller of the present invention.
Figure 4:
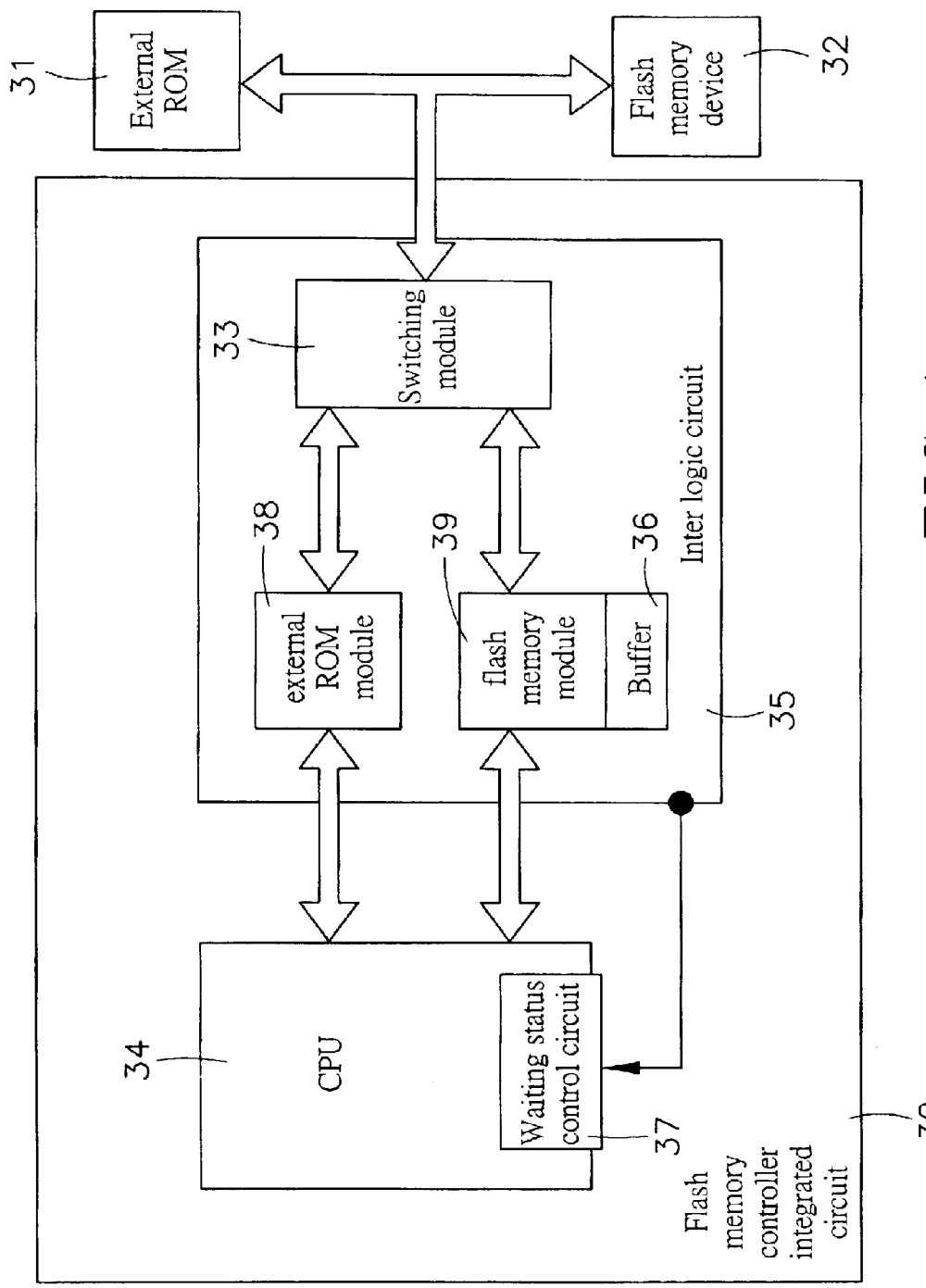
FIG. 4 is a flowchart illustrating the circuit layout (II) using a single integrated circuit flash memory controller of the present invention.

Referring to FIGS. 3 and 4, show the circuit layout (I) and the circuit layout (11) including a flash memory controller integrated circuit 30, an external ROM 31 such as flash memory device for storing a program code and at least one flash memory device 32 for storing the data, wherein the external ROM 31 and the flash memory device 32 are connected to a switching module 33 of the flash memory controller integrated circuit 30 through the same data and IP USB port. The switching module 33 is connected to a CPU 34 of the flash memory controller integrated circuit 30 through an external ROM module 38 or a flash memory module 39.

In a normal operating condition, the CPU 34 retrieves the prestored CPU program code from the external ROM 31 from time to time, for doing so, the flash memory controller integrated circuit 30 controls the internal logic circuit 35 to switch the switching module 33 to make an electrical connection between the CPU 34 and the external ROM 31, and external ROM module 38, so that the CPU 34 is able to retrieve the program code from the external ROM 31. Additionally, when the CPU 34 retrieves the data from the flash memory device 32, the flash memory controller integrated circuit 30 will cut the connection between the CPU 34 and the external ROM 31, and switch it to a waiting status control circuit 37 of the CPU 34 to make CPU 34 remain in waiting mode. Meanwhile, the flash memory controller integrated circuit 30 controls the internal logic circuit 35 to switch the switching module 33 to make an electrical connection between the flash memory device 32 that has a buffer 36 and the flash memory module 39 of the flash memory controller integrated circuit 30, to enable the CPU 34 to retrieve data from flash memory device 32 through the buffer 36. After retrieving of the data is completed, the internal logic circuit 35 of the flash memory controller integrated circuit 30 controls the switching module 33 to switch back the connecting between the CPU 34 and external ROM 31, and also transmits a resume signal to the CPU 34 to continuously execute the retrieval of the program code from the external ROM 31. Because the external ROM 31 and all the flash memory device 32 share the same data and IP USB port, and therefore require no additional pin terminals and also the size of the integrated circuit package need not be enlarged.

Figures 5, 6:
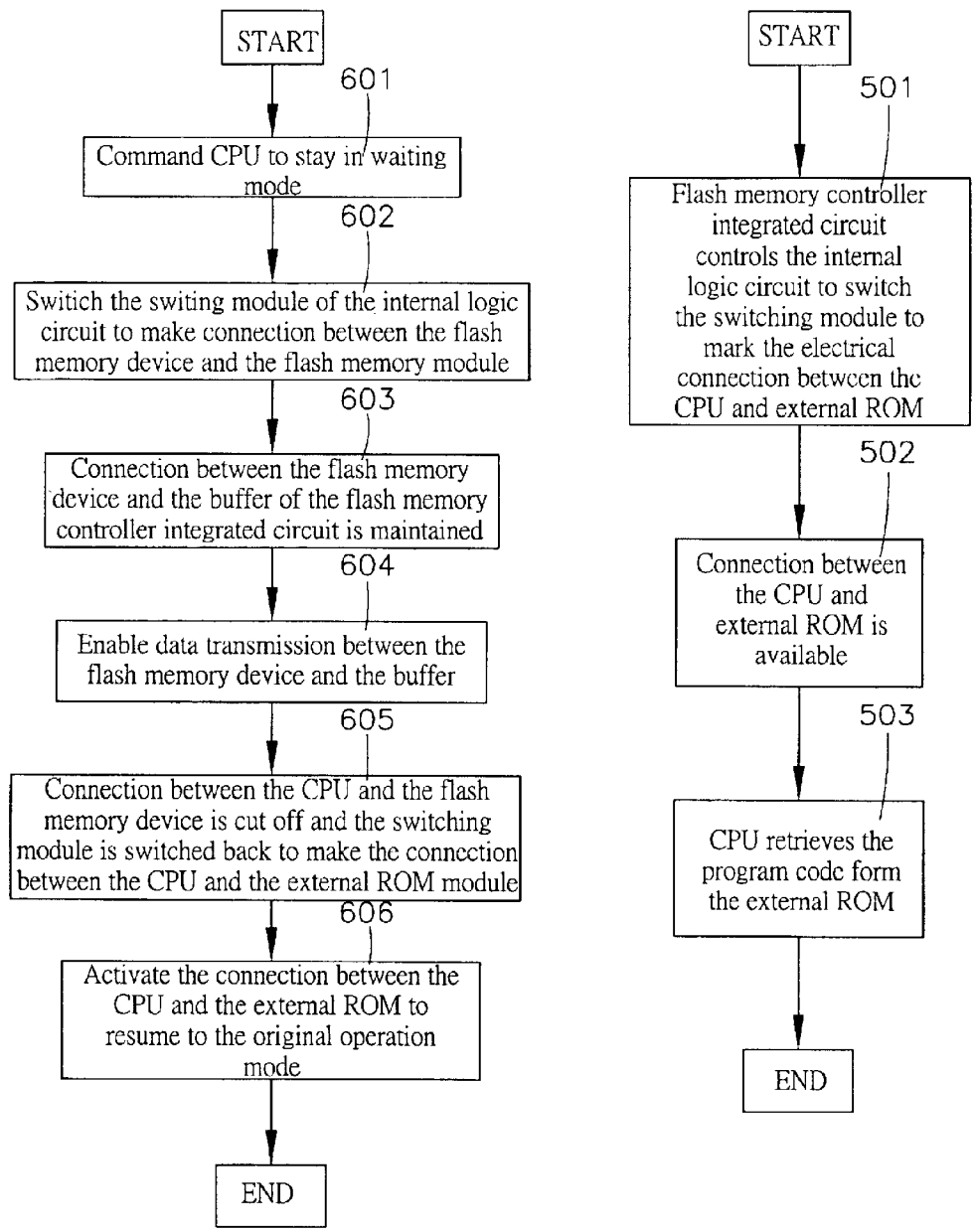
FIG. 5 is a flowchart illustrating the operation process using the circuit layout (I)
FIG. 6 is a flowchart illustrating the operation process using the circuit layout (II).

Referring to FIGS. 4 and 5, show the operating process using the circuit layout (I) and the circuit layout (II). In a normal operating condition, the CPU 34 retrieves the prestored program code from the external ROM 31, this process can be executed as follows. The process begins with (501) in which the flash memory controller integrated circuit 30 controls the internal logic circuit 35 to switch the switching module 33 to make the electrical connection between the CPU 34 and external ROM 31, then the process proceeds to step (502). In step (502) the connection between the CPU 34 and external ROM 31 continued. Next, in step (503) the CPU 34 retrieves the program code from the external ROM 31 and the retrieval process end in step (503).

Referring to FIGS. 4 and 6, when the CPU 34 retrieves the program code from the flash memory device 32, the process is executed as follows. The process begins from step (601) in which the flash memory controller integrated circuit 30 interrupts the communication between the CPU 34 and external ROM 31, and switch it to the waiting status control circuit 37 of the CPU 34 to keep the CPU 34 in the waiting status and cut off the retrieving of the program code from the external ROM 31 and the process proceeds to step (602). In step (602) the internal logic circuit 35 switches the switching module 33 to make connection between the flash memory device 32 and the flash memory module 39. Next, in step (603) the connection between the flash memory device 32 and the buffer 36 of the flash memory controller integrated circuit 30 is maintained and then the process proceeds to step (604). In step (604) the flash memory device 32 is enabled to communicate with buffer 36 through the connection described in step (603) allowing the CPU 34 to retrieve data from the buffer 36. Next, in step (605) after completing data retrieval, and then the connection between the CPU 34 and the flash memory device 32 is cut off and the switching module 33 is switched back to make the connection between the CPU 34 with the external ROM 31 and the external ROM module 38. Next, in step (606) in order to make a connection between the CPU 34 and the external ROM 31 a resume signal is transmitted to the CPU 34 for returning to the original operation mode, and then the process ends in step (606).

Additionally, the flash memory device 32 may be a flash memory array.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A single integrated circuit flash memory controller for activating an external ROM sharing a common USB port, comprising:

a flash memory controller integrated circuit;

an external ROM for storing program code; and at least one flash memory device for storing data; wherein the external ROM and the flash memory device are connected to the switching module of the flash memory controller integrated circuit through a same data and IP USB port, and the switching module connects to a CPU of said flash memory controller integrated circuit for enabling said flash memory controller integrated circuit to control a internal logic circuit to switch the switching module for making connection between said CPU and said external ROM so that said CPU retrieves the program code from said external ROM, and wherein when said CPU needs to retrieve data from said flash memory device, said flash memory controller integrated circuit will interrupt the connection between said CPU and said external ROM and switch to a waiting status control circuit of said CPU and thereby switching said CPU remain in a waiting mode without further retrieving program code from said external ROM, meanwhile said flash memory controller integrated circuit controls an internal logic circuit to switch said switching mode to make a connection between said flash memory device that has a buffer and a flash memory module of said flash memory controller integrated circuit to enable said CPU to retrieve data from said flash memory device through said buffer and after completing data retrieval, said internal logic circuit of said flash memory controller integrated circuit cuts off the connection between said CPU and the flash memory device and switches back to make connection between said CPU and said external ROM, and also transmits a resume signal to said CPU for continuously executing and retrieving the program code from said external ROM.

2. The single integrated circuit flash memory controller according to claim 1, wherein said flash memory device is a flash memory array.

3. The single integrated circuit flash memory controller according to claim 1, wherein said external ROM is a flash memory device.

* * * * *